United States Patent
Mizuno et al.

(10) Patent No.: US 7,551,054 B2
(45) Date of Patent: Jun. 23, 2009

(54) ELECTRONIC DEVICE AND METHOD OF MANUFACTURING THE SAME

(75) Inventors: Yoshihiro Mizuno, Kawasaki (JP); Xiaoyu Mi, Kawasaki (JP); Hisao Okuda, Kawasaki (JP); Hiromitsu Soneda, Kawasaki (JP); Satoshi Ueda, Kawasaki (JP); Takeo Takahashi, Sannohe (JP)

(73) Assignees: Fujitsu Limited, Kawasaki (JP); Fujitsu Media Devices Limited, Yokohama (JP)

( * ) Notice: Subject to any disclaimer, the term of this patent is extended or adjusted under 35 U.S.C. 154(b) by 251 days.

(21) Appl. No.: 11/288,142

(22) Filed: Nov. 29, 2005

(65) Prior Publication Data

US 2006/0114077 A1  Jun. 1, 2006

(30) Foreign Application Priority Data

Nov. 30, 2004 (JP) .............................. 2004-347816

(51) Int. Cl.
*H01F 5/00* (2006.01)
(52) U.S. Cl. ..................................................... 336/200
(58) Field of Classification Search ................. 336/65, 336/83, 200, 232, 206–208
See application file for complete search history.

(56) References Cited

U.S. PATENT DOCUMENTS

| | | | |
|---|---|---|---|
| 5,175,518 A | 12/1992 | Swanson, Jr. et al. | |
| 5,416,356 A * | 5/1995 | Staudinger et al. | 257/531 |
| 6,445,271 B1 * | 9/2002 | Johnson | 336/200 |
| 7,167,064 B2 * | 1/2007 | Miyaguchi et al. | 333/164 |
| 7,305,223 B2 * | 12/2007 | Liu et al. | 455/333 |
| 2004/0080021 A1 | 4/2004 | Casper et al. | |
| 2005/0032484 A1 * | 2/2005 | Itakura et al. | 455/114.1 |
| 2006/0141978 A1 * | 6/2006 | Liu | 455/333 |

FOREIGN PATENT DOCUMENTS

| | | |
|---|---|---|
| CN | 1380690 | 11/2002 |
| EP | 1 160 869 A2 | 12/2001 |
| EP | 1 411 553 A1 | 4/2004 |
| JP | 01223758 A * | 9/1989 |
| JP | 04-61264 A | 2/1992 |
| JP | 05-03404 A | 1/1993 |
| JP | 06-181119 A | 6/1994 |

OTHER PUBLICATIONS

Harrie A C Tilmans et al., "MEMS for Wireless Communications: From RF-MEMS Components to RF-MEMS-SiP", Journal of Micromechanics and Microengineering, 2003, pp. S139-S163.

\* cited by examiner

*Primary Examiner*—Tuyen T. Nguyen
(74) *Attorney, Agent, or Firm*—Arent Fox LLP

(57) ABSTRACT

An electronic device includes: an insulating substrate; at least one capacitor and an inductor that are formed directly on the insulating substrate; a line that connects the capacitor and the inductor from the above; and an external connecting pad unit that is made of the same conductor as the line and is disposed on the insulating substrate.

13 Claims, 10 Drawing Sheets

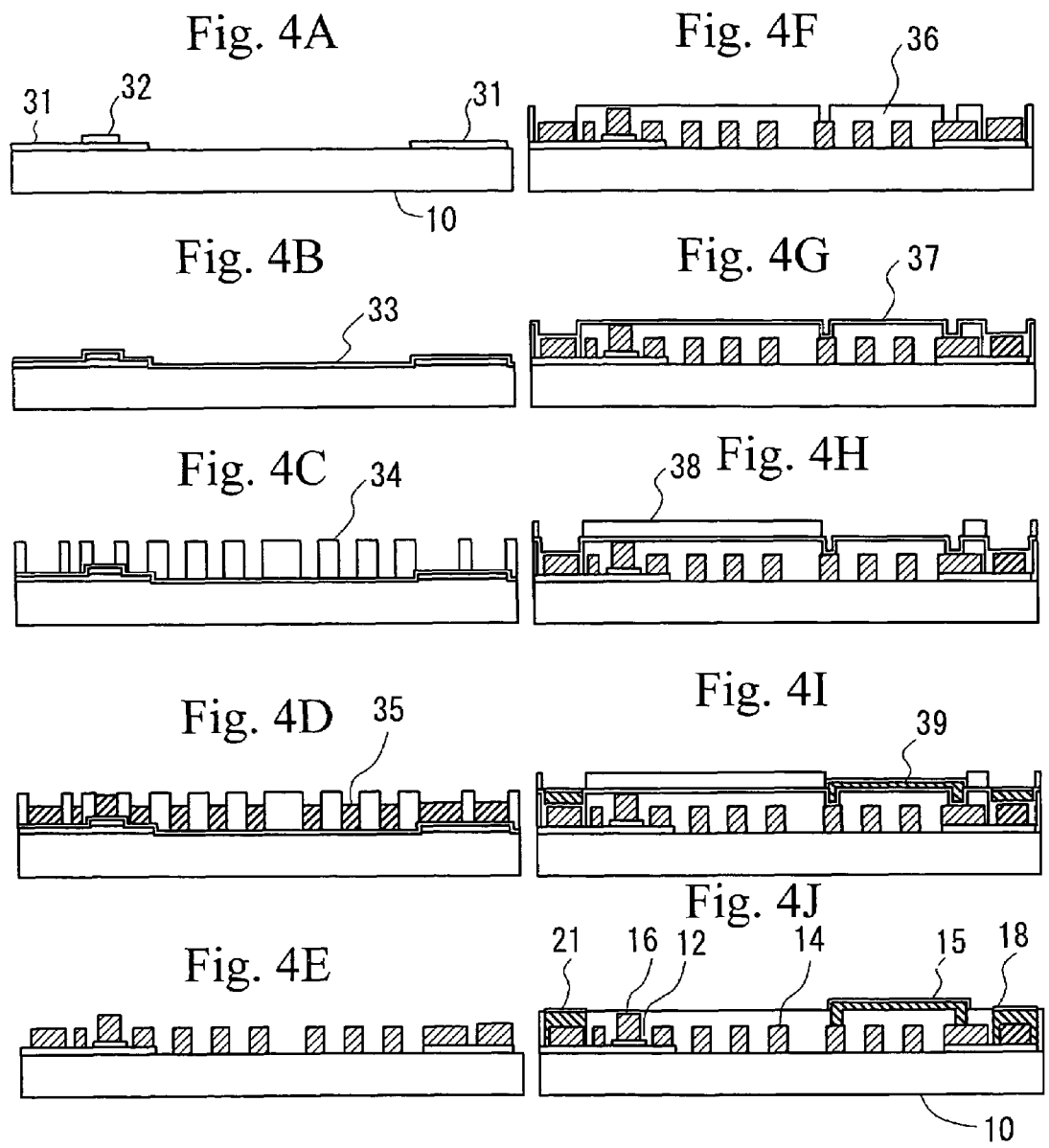

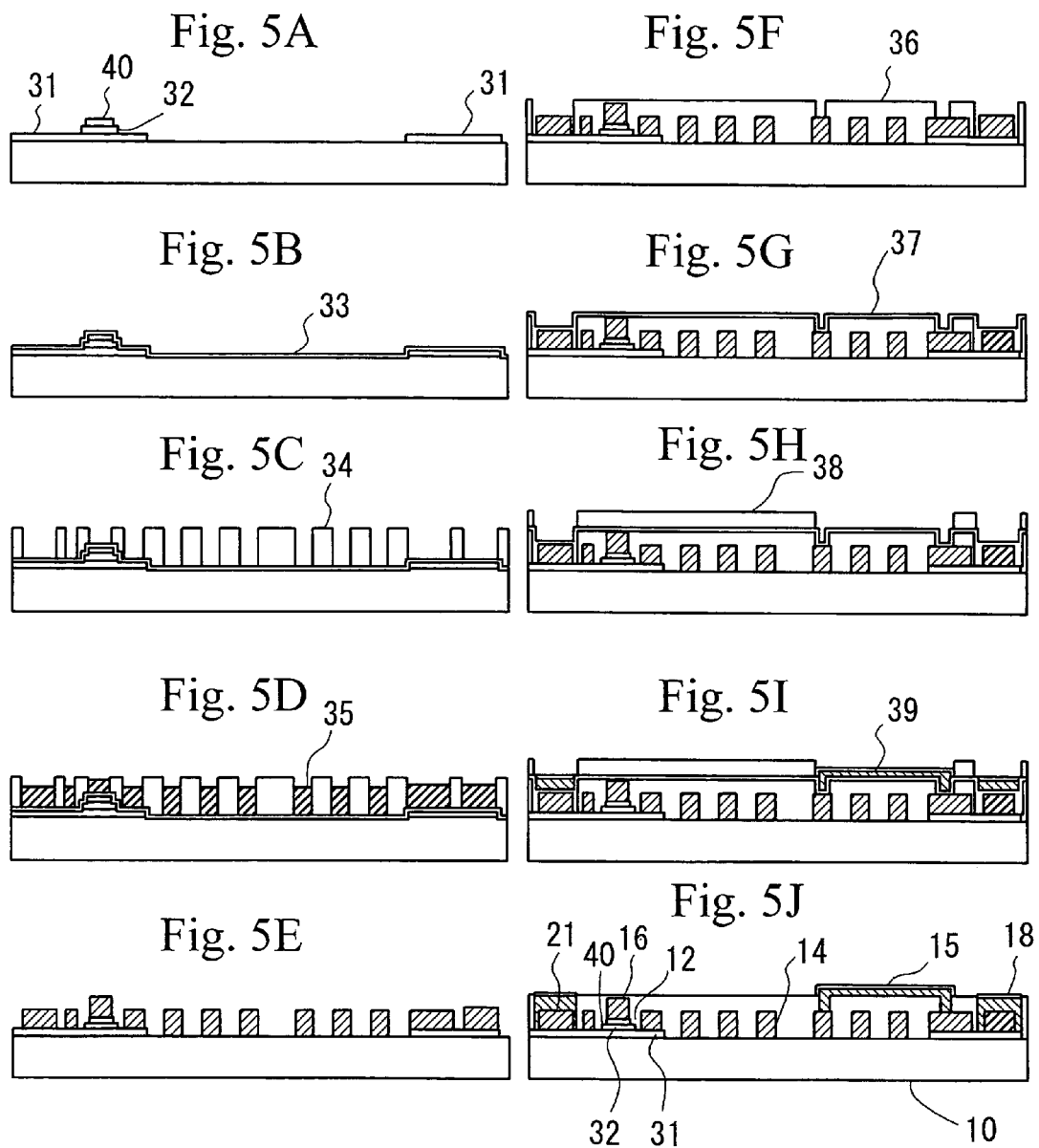

Fig. 7A
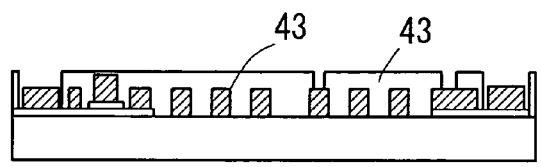
Fig. 7F
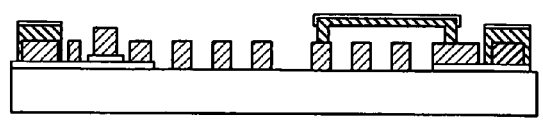
Fig. 7B
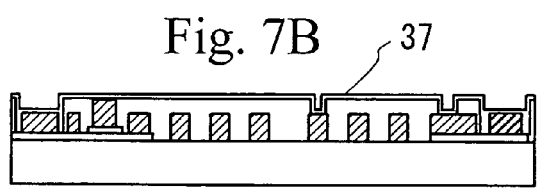
Fig. 7G
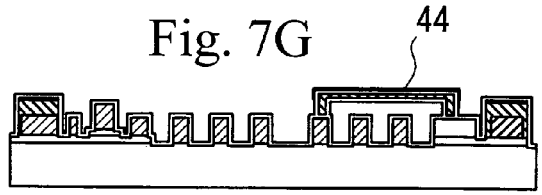
Fig. 7C
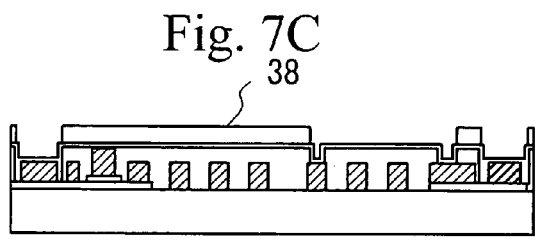
Fig. 7H
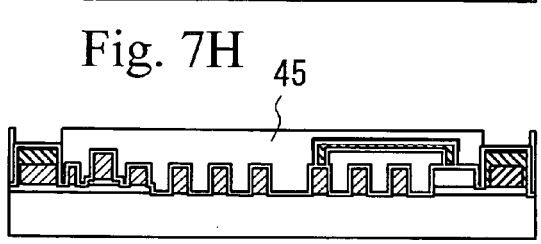
Fig. 7D
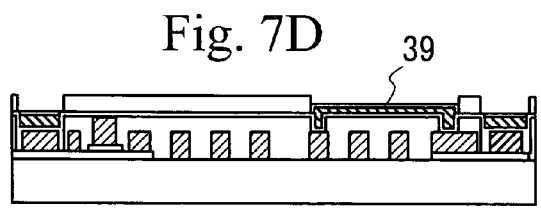
Fig. 7I
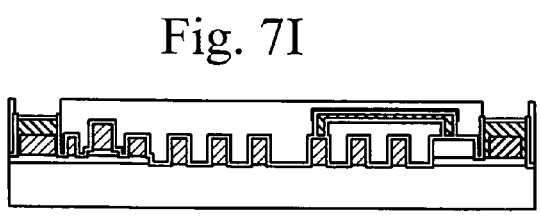
Fig. 7E
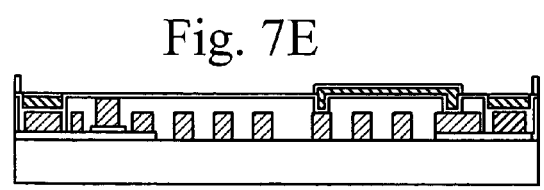
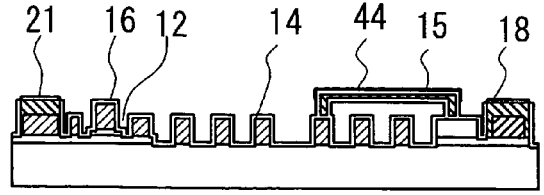
Fig. 7J Fig. 9A
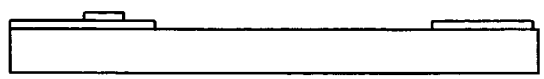
Fig. 9F 36
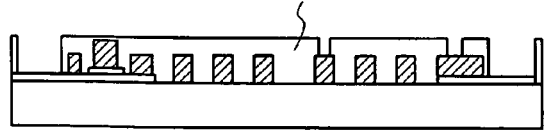
Fig. 9B
Fig. 9G 37
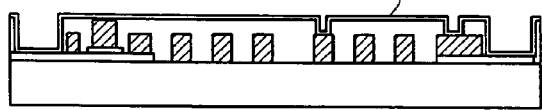
Fig. 9C 34  34A
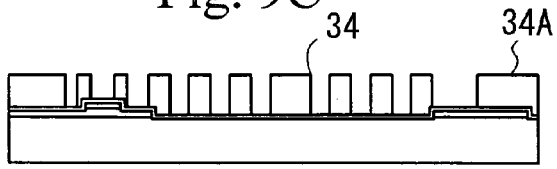
38 Fig. 9H
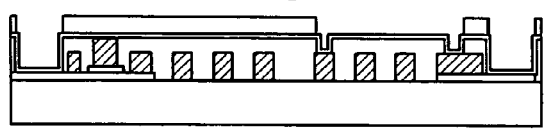
Fig. 9D 35
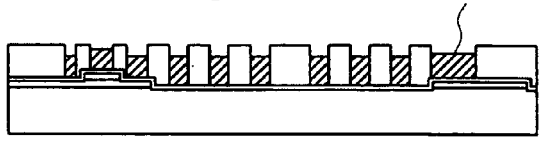
Fig. 9I 39
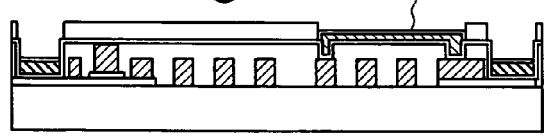
Fig. 9E
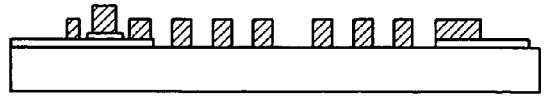
21 16 12 36 14   15 18
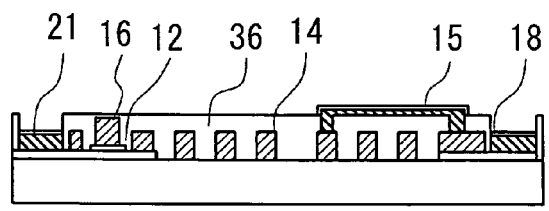
Fig. 9J

ELECTRONIC DEVICE AND METHOD OF MANUFACTURING THE SAME

BACKGROUND OF THE INVENTION

1. Field of the Invention

The present invention generally relates to an electronic device and a method of manufacturing the same, and more particularly, to a device for radio-frequency modules in RF (radio frequency) systems that are used for wireless communication. With respect to the devices of this kind, there is an increasing demand for lighter, smaller devices with higher performance, smaller power consumption, and lower production costs. So as to obtain such devices, IPDs (Integrated Passive Devices) have become essential. An IPD is formed by integrating passive devices such as inductors and capacitors. The present invention relates to the structure of such an IPD and a method of manufacturing the IPD.

2. Description of the Related Art

Conventionally, passive devices are contained in or integrated with a substrate, so that the resultant device can be made smaller. In this manner, however, it is difficult to satisfy the demand for smaller devices that can be manufactured at lower production costs. For example, passive devices are formed between layers of a multi-layer substrates made of LTCC (low-temperature co-fired ceramic), and ICs or SAW filters are connected onto the layers with wires. For a smaller device, however, it is necessary to prepare a larger number of layers, and therefore, the production costs tend to increase, as well as the complexity in design. So as to eliminate this problem, attention is being drawn toward the development of an IPD in which passive devices are integrated by stacking thin films on a substrate made of ceramic, glass, silicon, or the like. For example, Harrier A. C. Timans, et al., disclose an IDP in "MEMS for wireless communications: 'from RF-MEMS components to RF-MEMS-Sip', IMEC vzw. Division Microsystems, Components and Packaging, 2003, pp. S139-S163", in which lines and capacitors are formed on a glass substrate, and a dielectric layer (of a low-permittivity resin, such as BCB with E of 2.65) is formed over the lines and capacitors. A spiral inductor is formed on the resultant structure. Further, another dielectric material to cover the inductor is formed on the inductor, and pads on which wires and bumps are to be formed for connecting with the lines and other devices are prepared. Using an IPD chip manufactured by the above technique, it is possible to post-mount the device to a module in combination with a mounting technique such as SMT (surface mount technology), CSP (chip-scale package), SoC (system-on-chip), or SiP (system-in-a-package). It is also possible to mount ICs or SAW filters directly to the device. Accordingly, great decreases in production costs and sizes of the modules are expected. Harrier A. C. Timans, et al., also disclose various examples of RF modules on which IPDs are mounted. Other than Harrier A. C. Timans, et al., IDPs are disclosed in Japanese Unexamined Patent Publication Nos. 5-3404 and 4-61264 and U.S. Pat. No. 5,175,518.

With any of the above conventional structures, however, a large number of procedures and materials are required, resulting in high production costs. Therefore, it is difficult to produce less expensive devices in view of the use for low-cost modules to be built in mobile-phone handsets. Since the processing using a thick dielectric film is performed two or more times, and many procedures for removing metal films used in plating procedures are added to the manufacturing procedures, it is difficult to stabilize the processing conditions. The large number of layers also leads to a decrease in the reliability such as heat resistance of the device. Furthermore, as a thin, multi-layer dielectric film is used, the substrate is bent due to the difference in thermal expansion coefficient between the substrate and the dielectric film, if the substrate is thin. This hinders the use of a large-diameter substrate. In addition to that, as a thin-film metal film formed by sputtering or vapor deposition is used as part of the lines, the resistance becomes higher due to the skin effect caused by radio frequencies, and the device characteristics deteriorate.

SUMMARY OF THE INVENTION

It is therefore an object of the present invention to provide an electronic device and a method of manufacturing the device in which the above disadvantage is eliminated.

A more specific object of the present invention is to provide a highly reliable electronic device that is manufactured by a simpler method and has a simpler structure than a conventional device. Another specific object of the present invention is to provide a method of manufacturing the electronic device.

According to an aspect of the present invention, there is provided an electronic device comprising: an insulating substrate; at least one capacitor and an inductor that are formed directly on the insulating substrate; a line that connects the at least one capacitor and the inductor from the above; and an external connecting pad unit that is made of the same type of conductor as the line and is disposed on the insulating substrate.

According to another aspect of the present invention, there is provided a method of manufacturing an electronic device, comprising the steps of: forming a capacitor and an inductor directly on an insulating substrate; and simultaneously forming a pad through a plating process and a line for connecting the capacitor and the inductor.

Thus, the present invention provides a highly reliable electronic device that can be manufactured by a simpler method and has a simpler structure than a conventional device. The present invention also provides a method of manufacturing the electronic device.

BRIEF DESCRIPTION OF THE DRAWINGS

Other objects, features and advantages of the present invention will become more apparent from the following detailed description when read in conjunction with the accompanying drawings, in which:

FIGS. 4A through 4J illustrate a structure and a manufacturing method in accordance with the first embodiment;

FIGS. 5A through 5J illustrate a structure and a manufacturing method in accordance with the second embodiment;

FIGS. 7A through 7J illustrate a structure and a manufacturing method in accordance with the third embodiment;

FIGS. 9A through 9J illustrate a structure and a manufacturing method in accordance with the fifth embodiment;

DESCRIPTION OF THE PREFERRED EMBODIMENTS

Figure 1:
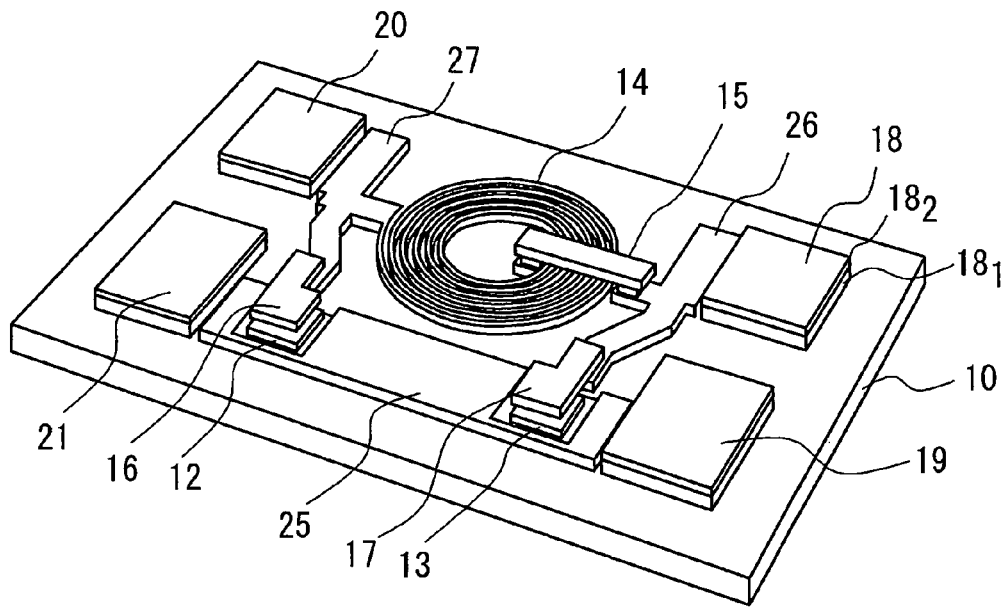
FIG. 1 is a perspective view of one embodiment of the present invention.
Figure 2:
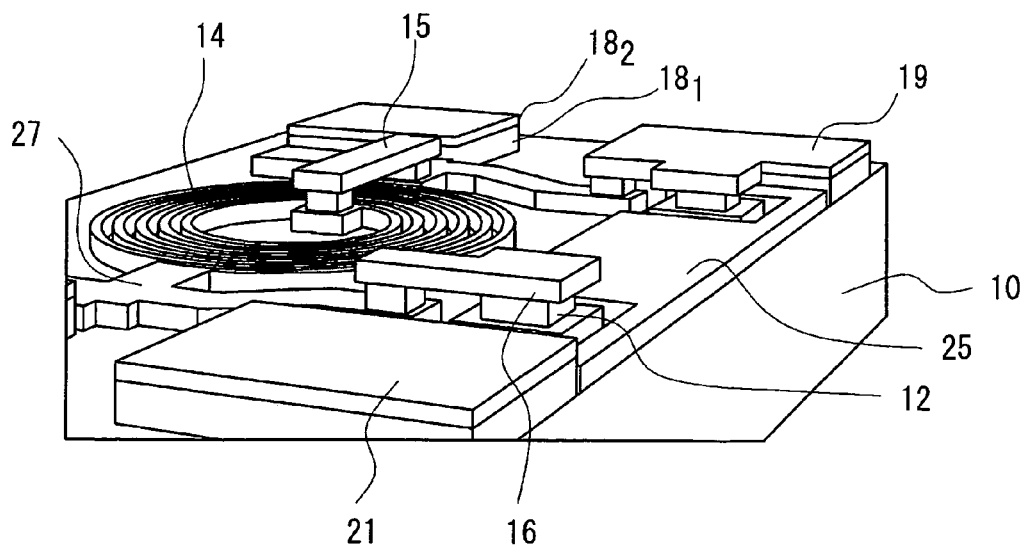
FIG. 2 is a partially enlarged perspective view of the embodiment illustrated in FIG. 1.

FIG. 1 is a perspective view of an electronic device in accordance with a first embodiment of the present invention. FIG. 2 is a perspective view of the electronic device, seen from a different angle. This electronic device includes an insulating substrate 10, capacitors 12 and 13 that are formed directly on the insulating substrate 10, an inductor 14, lines 15 through 17 that connect the capacitors 12 and 13 and the inductor 14 from the above, and external connection pads 18 through 21 that are conductors of the same type as the lines 15 through 17 and are formed on the insulating substrate 10. The electronic device also includes an insulating film 36 (not shown in FIGS. 1 and 2) that covers the capacitors 12 and 13 and the inductor 14. The lines 15 through 17 are disposed on the insulating film 36. The insulating film 36 is a conformal insulating film that covers the circuit forming face (the component forming face) of the electronic device, except for the surfaces of the pads 18 through 21, with high step coverage. The lines 15 through 17 can be formed over the capacitors 12 and 13 and the inductor 14 via an air gap, which is called a "free-standing state". This electronic device may further include a resistor. Also, as will be described later, the pads 18 through 21 may be formed on convexities of the insulating substrate 10. The pads 18 through 21 may also be formed with the same two layers as the layers that form the spiral inductor 14 and the lines 15 through 17. For example, the pad 18 is formed with the layer 18, that forms the inductor 14 and the layer $18_2$ that forms the lines 15 through 17. As will be described later, the layers that form the lines 15 through 17 can be designed to cover the outer periphery of at least one of the regions formed by the same layer as the inductor 14. Further, the upper electrodes of the capacitors 12 and 13 can be formed with the same layer as the inductor 14. An insulating film is formed on the upper electrodes of the capacitors 12 and 13, and covers the outer peripheries of the upper electrodes. The areas that are not covered with the insulating film may be connected to the inductor 14 via the lines 16 and 17.

In the following, embodiments of the present invention will be described. FIGS. 3A through 3F are cross-sectional views of electronic devices in accordance with first through sixth embodiments. Each of the cross-sectional view shows the pad 18, the line 15, the inductor 14, the capacitor 12, and the pad 21 of the electronic device illustrated in FIGS. 1 and 2. The structure of each of the embodiments will be described in conjunction with the method of manufacturing each embodiment described below.

First Embodiment

Figure 3A:
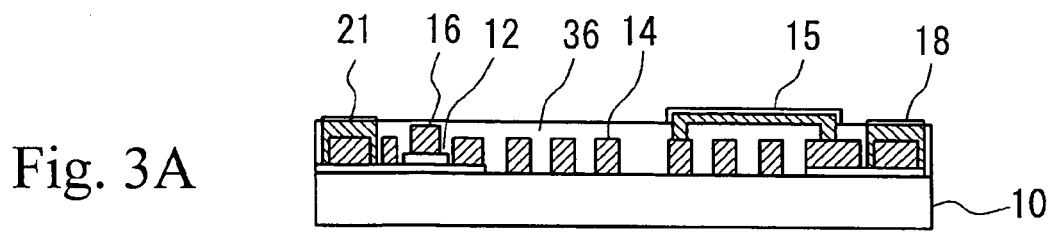
FIGS. 3A through 3F are cross-sectional views of electronic devices of first through sixth embodiments of the present invention.

FIGS. 4A through 4J illustrate the method of manufacturing the electronic device in accordance with the first embodiment shown in FIG. 3A. A metal pattern 31 is formed on the insulating substrate 10 made of quartz (or synthetic quartz) or glass (such as Pyrex (registered trademark), Tempax, aluminosilicate glass, or borosilicate glass) (FIG. 4A). This metal pattern 31 serves as the lower electrode of the capacitor 12 with a MIM (Metal-Insulator-Metal) structure. The material for the first-layer metal pattern 31 preferably contains Al, Au, or Cu with relatively low resistance as a main component. The metal pattern 31 may have a multi-layer structure. For example, the metal pattern 31 may have a four-layer structure of Ti/Au/Ni/Au (20 nm/500 nm/20 nm/500 nm). Next, a pattern 32 for the capacitor 12 is formed. Although not shown in FIG. 4B, a pattern for the capacitor 13 is also formed. The material for the pattern 32 of the capacitors 12 and 13 may be a dielectric film made of $SiO_2$, $Si_3N_4$, $Al_2O_3$, $Ta_2O_5$, or the like, which is formed by sputtering or PECVD (plasma enhanced chemical vapor deposition). For example, the pattern 32 is a PECVD $SiO_2$ film of 195 nm in thickness. Next, a seed metal layer 33 for electroplating is formed (FIG. 4B). The material for the seed metal layer 33 is preferably the same as the material for later electroplating, and may be a sputtered metal film of Ti/Cu (20 nm/500 nm), for example.

Next, a photoresist pattern 34 for patterning the plating is formed on the seed metal layer 33 (FIG. 4C). The resist is formed in accordance with the plating height, the plating fluid, and the temperature at which the pattern is formed. For example, the photoresist pattern 34 is formed using an alkali-resistant resist of 12 μm in thickness. The spiral inductor 14 is formed with a pattern of 10 μm in width with 10 μm intervals. After a plating layer 35 is formed by the electroplating method (FIG. 4D), the photoresist 34 and the seed metal layer 33 are removed (FIG. 4E). For example, a Cu plating film of 10 μm in height is formed, and the inductor 14 and the lines (for example, the lines 25 through 27 shown in FIG. 1) are formed with the same layer. The resist 34 is then removed with a special resist remover, and the seed metal layer 33 is also removed. The removal of the seed metal layer 33 may be carried out by the ion milling process. Next, a dielectric film 36 with a conformal film thickness is formed (FIG. 4F). The material for the dielectric film 36 may be polyimide, BCB (benzocyclobutene), or the like. The dielectric film 36 has such a film thickness as to cover the entire inductor 14. A pattern is further formed so as to expose the pad 18 and the base at the center of the coil 14, and a seed layer 37 is formed through a curing procedure (FIG. 4G). The seed layer 37 may be a sputtered metal film of Ti/Cu (20 nm/500 nm), for example. Further, a plating photoresist pattern 38 for forming the upper lines of the pads 18 through 21 (equivalent to the layer 182 shown in FIG. 1) and the upper line of the inductor 14 is formed with a height 2 μm greater than the height of the pads 18 through 21 (FIG. 4H).

A metal plating layer 39 is then formed, thereby completing the line on the inductor 14 and the pads 18 through 21 (FIG. 4I). The plating layer 39 may be formed with more than one layer (for example, a nickel layer and a gold layer). Lastly, the photoresist 38 and the seed metal layer 37 are removed (FIG. 4J). Here, the IDP shown in FIG. 3A is completed. In the pad forming procedure shown in FIG. 4I, a plating layer or a sputtered metal layer may be added onto the pads 18 through 21. Since the distance between the inductor 14 and the line 39 formed thereon varies with the film thickness of the dielectric film 36 made of BCB, a difference is caused in stray capacitance. This causes a difference in characteristics. Therefore, the film thickness of the dielectric film 36 should preferably be made so thick as to maintain a sufficient distance between the upper line 39 and the inductor 14. For example, BCB is applied onto the inductor 14 so as to form a film of 2.5 μm in thickness, and the upper line 39 is formed thereon. Only some parts (the upper portions) of the pads 18 through 21 and the lines 15 through 17 are exposed through the dielectric film 36, and the inductor 14 and the capacitors 12 and 13 are covered with the BCB film 36.

In FIG. 3A and FIG. 4J, the pads 18 through 21 are formed with the two layers (equivalent to the layers $18_1$ and $18_2$ shown in FIGS. 1 and 2) that also form the spiral inductor 14 and the lines 15 through 17 (the plating layer 39). The plating layer 39 shown in FIG. 3A and FIG. 4J has a two-layer structure that is formed by performing gold plating on a nickel film. The layer forming the lines 15 through 17 (the plating layer 39) covers the outer periphery of at least one of the regions formed with the layer that also forms the inductor 14, i.e., the outer periphery of the first layer of the pads 18 through 21 formed with the layer that also forms the inductor 14. Likewise, the upper electrodes of the capacitors 12 and 13 are formed with the layer that also forms the inductor 14. The insulating film 36 is formed on the upper electrodes of the capacitors 12 and 13, so as to cover the outer peripheries of the upper electrodes. The uncovered regions are connected to the inductor 14 via the lines 16 and 17.

In the first embodiment, a resistance layer can be formed in the region of the line 25 or in other free regions. By doing so, an IPD that has a resistor in addition to the inductor 14 and the capacitors 12 and 13 can be obtained. This structure with a resistor is not limited to the first embodiment, but may also be applied to any of the IDPs of the second through sixth embodiments described later.

Second Embodiment

Figure 3B:
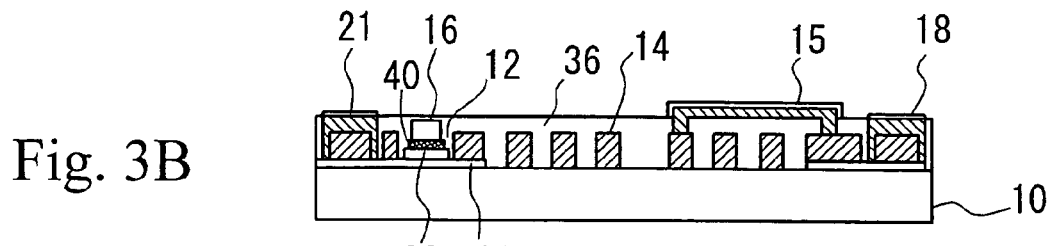

FIGS. 5A through 5J illustrate a method of manufacturing the electronic device in accordance with the second embodiment shown in FIG. 3B. This method is the same as the method illustrated in FIGS. 4B through 4J, except for the procedure shown in FIG. 5A. The second embodiment differs from the first embodiment in having a second metal layer 40. In the first embodiment, the Cu plating layer 35 is used as the upper electrode layer formed on the capacitor layer 32. In the second embodiment, on the other hand, the second metal layer 40 is used as the upper electrode layer. If the Cu plating layer 35 is thick in the first embodiment, the patterning accuracy is low, and the desired capacitance is difficult to obtain. To counter this problem, the second metal layer 40 is formed, and the Cu plating layer 35 is formed on the second metal layer 40, thereby maintaining high capacitance accuracy. The second metal layer 40 may be removed in the seed layer removing procedure, because of its material and how it is processed. In such a case, the process illustrated in FIGS. 6A through 6D is carried out. As shown in FIGS. 6A through 6D, a dielectric film (such as an oxide film) 41 is formed in the vicinity of the edge of the upper portion of the second metal layer 40, so that the capacitor film 32 can have a necessary area. The seed layer 33 and the Cu plating layer 35 are then formed. When the seed layer 33 is removed after the Cu plating, the dielectric film 41 formed on the second metal layer 40 prevents etching of the second metal layer 40. Accordingly, the film thickness of the capacitor film 32 formed with an oxide film and the pattern width of the dielectric film 41 formed on the second metal layer are controlled so as to determine the capacitance.

Third Embodiment

Figure 3C:
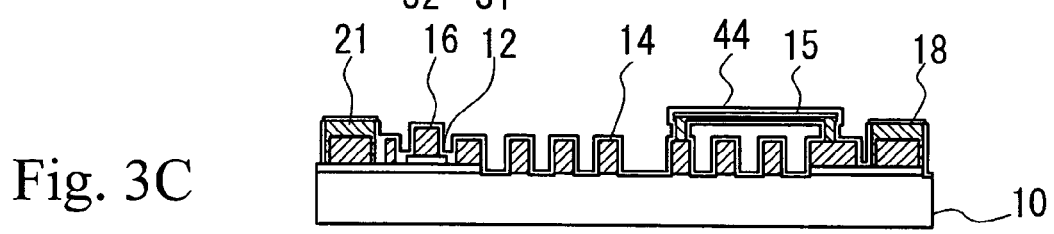

FIGS. 7A through 7J illustrate a method of manufacturing the electronic device in accordance with the third embodiment shown in FIG. 3C. Through the procedures shown in FIGS. 4A through 4E, the plating layer 35 for forming the inductor 14 is formed. After the seed layer 33 is removed, a photoresist pattern 43 is formed (FIG. 7A), instead of the dielectric film 36 for covering the inductor 14 in the first and second embodiments. After the seed layer 37 is formed on the photoresist pattern 43 (FIG. 7B), the photoresist pattern 38 is also formed (FIG. 7C). With the photoresist pattern 38, the plating layer 39 for forming the upper lines on the pads 18 through 21 and the inductor 14 is patterned (FIG. 7D). The photoresist pattern 38 is then removed (FIG. 7E). After the seed layer 37 is removed, the photoresist pattern 43 is also removed (FIG. 7F). By removing the photoresist pattern 43, the line 15 formed over the inductor 14 is put into a free-standing state (with an air gap being formed between the inductor 14 and the line 15). Accordingly, the stray capacitance between the inductor 14 and the line 15 can be reduced. Next, so as to prevent oxidization of the inductor 14 and the lines 15 through 17 exposed to the air, a conformal film 44 is formed on the entire surface (FIG. 7G). Here, parylene is used to form the conformal film 44 over the "free-standing" lines 15 through 17. The conformal film 44 made of parylene is formed by the CVD method, and can cover the lower sides of the lines 15 through 17. Next, etching of the parylene film is performed so as to expose the pads 18 through 21. A photoresist pattern 45 is formed (FIG. 7H), and $O_2$ plasma processing is then performed so as to etch the parylene on the pads 18 through 21 (FIG. 7I). After the parylene etching, the photoresist pattern 45 is removed to complete an IPD (FIG. 7J).

Fourth Embodiment

Figure 3D:
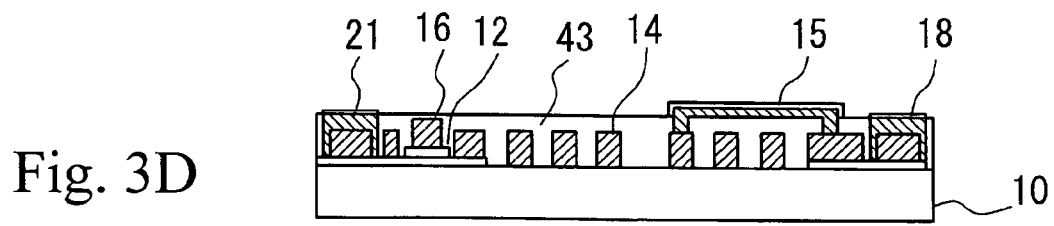
Figure 3E:
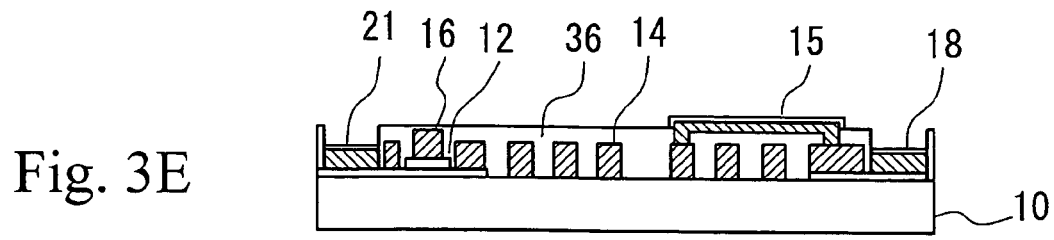
Figure 8A:
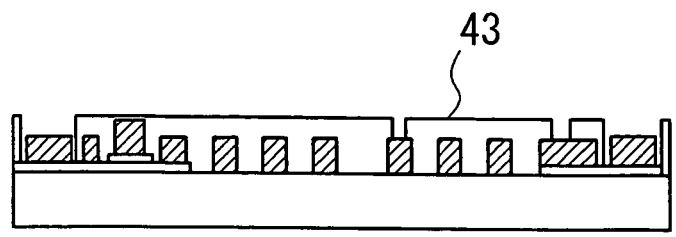
FIGS. 8A through 8F illustrate a structure and a manufacturing method in accordance with the fourth embodiment.
Figure 8B:
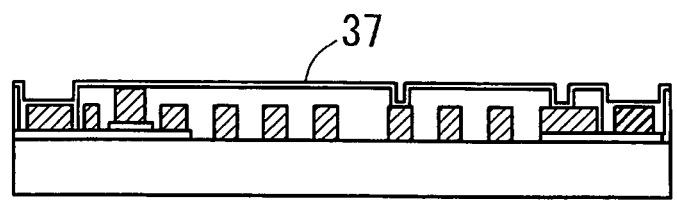
Figure 8C:
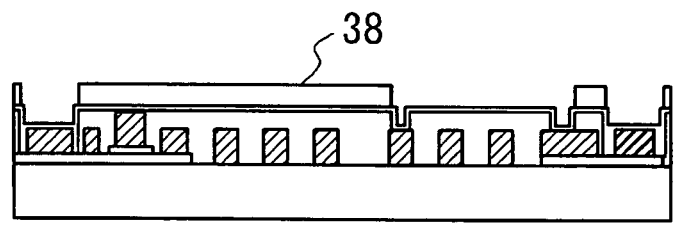
Figure 8D:
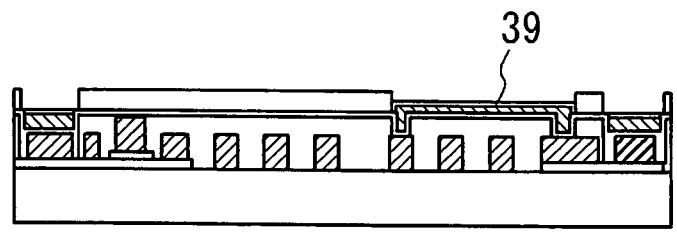
Figure 8E:
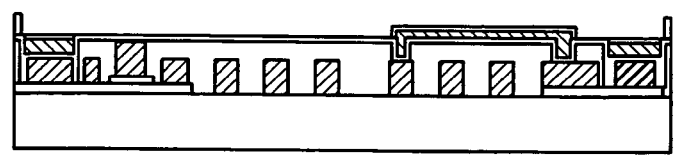
Figure 8F:
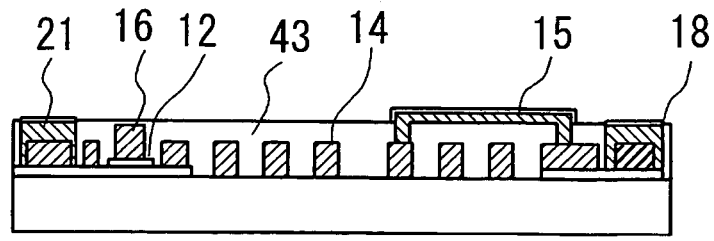

FIGS. 8A through 8F illustrate a method of manufacturing the electronic device in accordance with the fourth embodiment shown in FIG. 3D. After the procedures shown in FIGS. 4A through 4E, the thick dielectric film 36 is formed in FIG. 4F. In the fourth embodiment, however, a photoresist 43 is used instead, as shown in FIG. 8A. Without BCB or polyimide, which is costly, the production costs can be greatly lowered. Since the photoresist pattern 43 is to remain as a device layer, it is preferable to perform postbaking at a temperature of 200° C. or higher. The procedures shown in FIGS. 8A through 8F are the same as the above described procedures shown in FIGS. 7A through 7E.

Fifth Embodiment

In the manufacturing methods illustrated in FIGS. 4A through 8F, so as to increase the plating height of each of the pads 18 through 21, the same plating layer is formed on the inner side of each of the pads 18 through 21 during the plating procedure for forming the inductor 14. By increasing the pad height, the reliability in mounting can be increased, and the production costs can be lowered. For example, when an IPD chip of the present invention is mounted on another chip with high pads, the bumps can be made lower, and the clearance between the IPD chip and the other chip can be increased. As the bumps are made lower, the production costs can be greatly reduced, especially where the bumps are made of Au. At the same time, the margin of the clearance between the chips (the chips do not come into contact with each other even if the clearance is small) becomes larger. Accordingly, the reliability in the mounting procedures can be increased. The plating layer is formed inside each pad, because the pads might be deformed at the time of later bump formation or wire bonding if the pads are made of a relatively soft metal such as Cu. It is preferable to form a relatively hard Ni plating layer around the outer periphery of each Cu portion. In this embodiment, it is also possible to form a two-layer structure.

Meanwhile, it is possible to employ the manufacturing method in accordance with the fifth embodiment illustrated in FIGS. 9A through 9J. FIGS. 9A through 9J illustrate the method of manufacturing the electronic device shown in FIG. 3E. Here, the same plating layer as that formed in the plating procedure for forming the inductor 14 is not formed on the inner side of each of the pads 18 through 21. This single-layer method is effective in a case where each area is small and the pads are deformed in the post-processing procedure after the same plating layer as that of the inductor 14 is formed under each pad.

The procedures shown in FIGS. 9A through 9J correspond to the procedures shown in FIGS. 4A through 4J. The procedures shown in FIGS. 9A and 9B are the same as the procedures shown in FIGS. 4A and 4B. The procedure shown in FIG. 9C differs from the procedure shown in FIG. 4C in that the photoresist pattern 34 is formed also in the pad formation region. The procedures shown FIGS. 4D through 4J are the same as the procedures shown in FIGS. 9D through 9J. In the electronic device illustrated in FIG. 9J, the pads 18 through 21 are formed with a Ni plating layer 39 having an Au plating layer on its surface. Since the pads 18 through 21 do not include a Cu layer that is soft, the reliability in bonding can be increased.

Sixth Embodiment

Figure 3F:
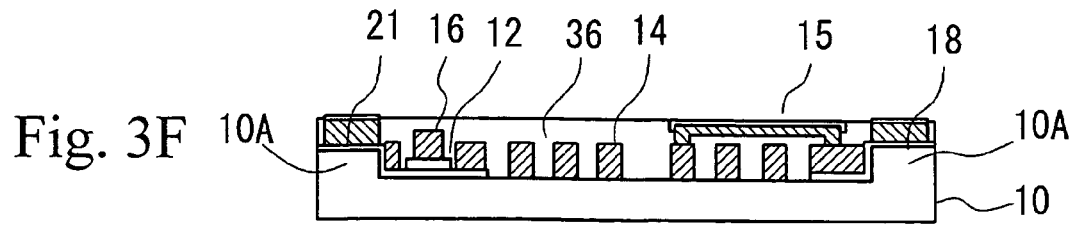
Figure 6A:
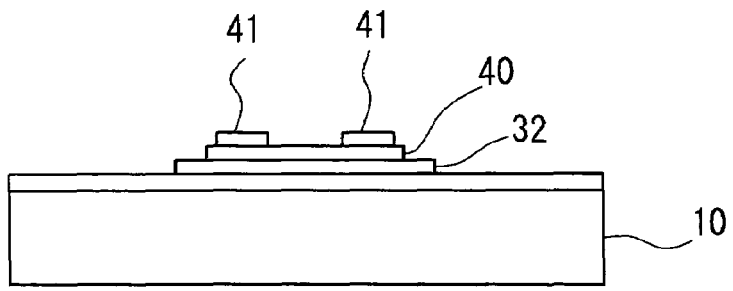
FIGS. 6A through 6D illustrate another manufacturing method in accordance with the second embodiment.
Figure 6B:
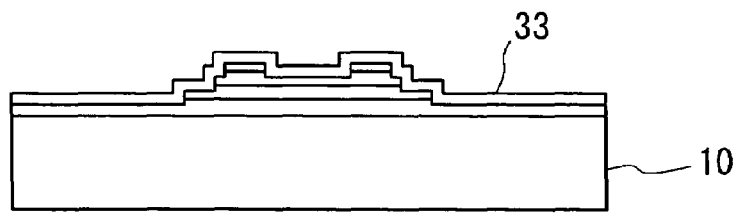
Figure 6C:
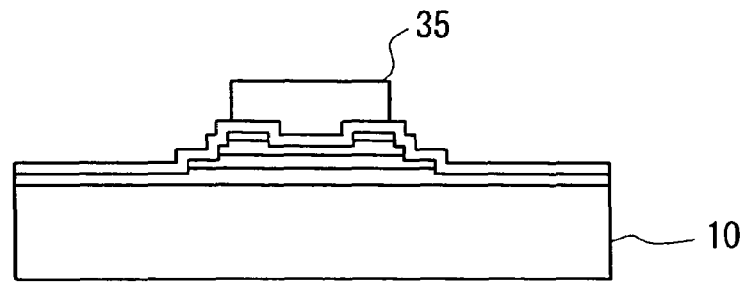
Figure 6D:
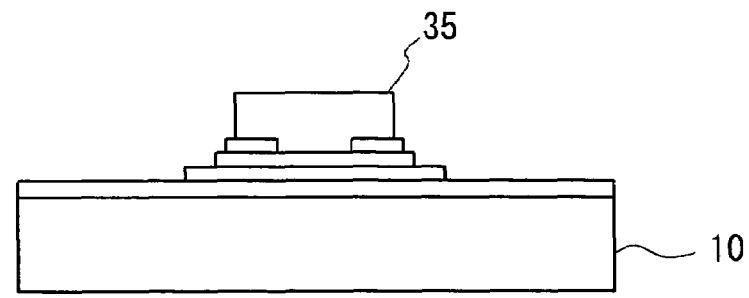

FIG. 3F is a cross-sectional view of the electronic device in accordance with the sixth embodiment. The insulating substrate 10 has convexities 10A at the locations at which the pads 18 through 21 are to be formed. With this arrangement, the pads 18 through 21 can be made taller. Accordingly, the clearance between the IPD chip and another chip on which the IDP chip is mounted can be made larger, without an increase of the plating film thickness of each of the pads 18 through 21.

Figure 10:
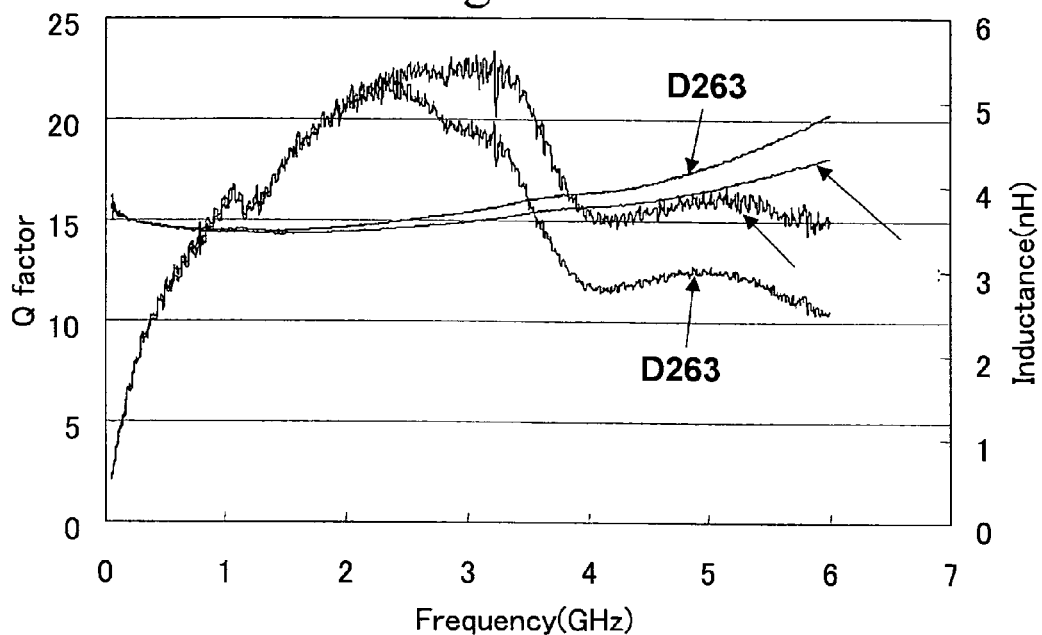
FIG. 10 is a graph showing the relationship between the material of the insulating substrate and the inductance characteristics.

FIG. 10 is a graph showing the relationship between the material of the insulating substrate 10 and the inductance characteristics in a case where the insulating substrate 10 is made of glass D263 ($\epsilon=6.7$ at 1 MHz) (manufactured by Schott AG) and where the insulating substrate 10 is made of synthetic quartz ($\epsilon=4$ at 1 MHz). In the graph shown in FIG. 10, the abscissa axis indicates the frequency (GHz), the left ordinate axis indicates the Q factor, and the right ordinate axis indicates the inductance (nH). The inner diameter of the inductor 14 is 150 μm, and the number of turns is 3.5. In both cases of D263 and synthetic quartz, the Q factors and the inductance values are almost the same up to 2 GHz. More specifically, up to 2 GHz, the same characteristics as those in the case where the inductor 14 is formed on a high-permittivity layer as in the prior art can be achieved in the case where the inductor 14 is formed on the insulating substrate 10 made of synthetic quartz having low permittivity. Accordingly, a D263 glass substrate should preferably be used at a frequency of 2 GHz or lower in the present invention.

Figure 11:
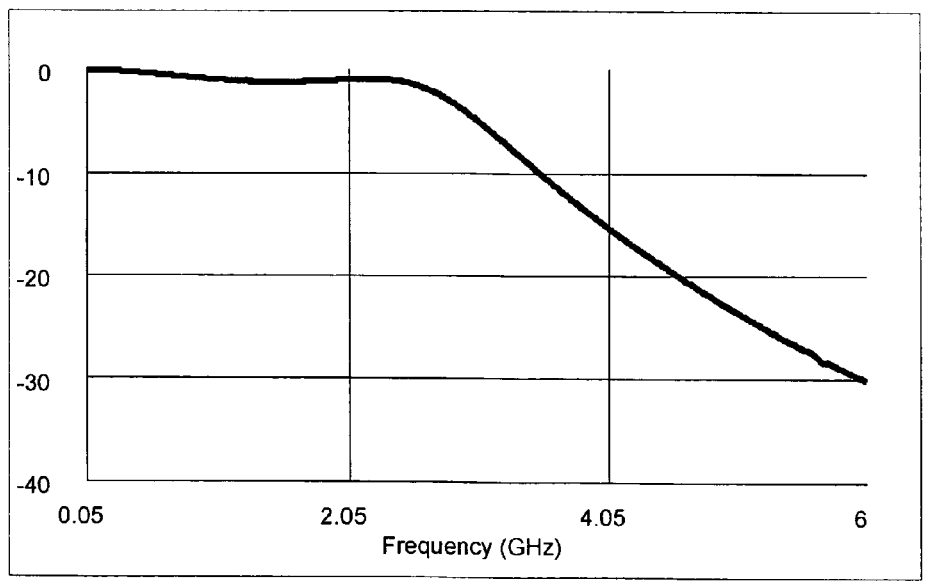
FIG. 11 shows the pass characteristics of an IDP chip having the structure illustrated in FIG. 1.
Figure 12:
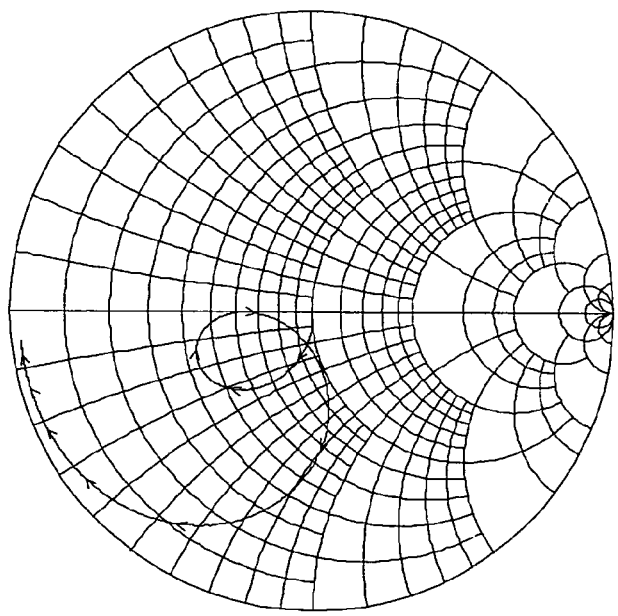
FIG. 12 shows the input-side reflection characteristics of an IDP chip having the structure illustrated in FIG. 1.
Figure 13:
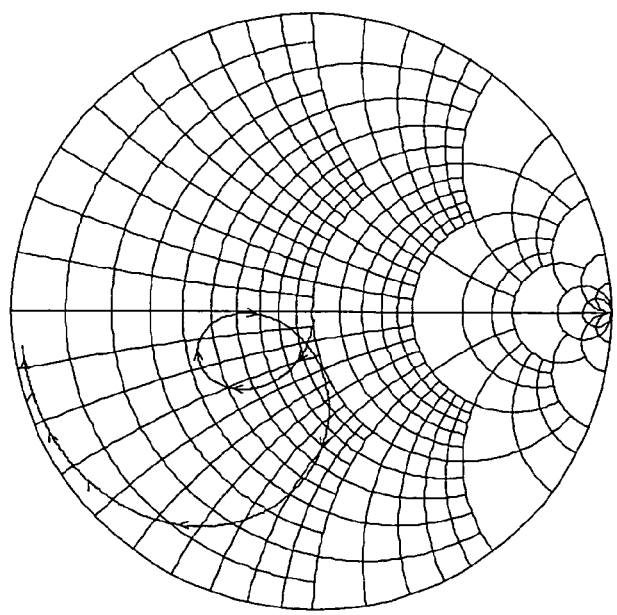
FIG. 13 shows the output-side reflection characteristics of an IDP chip having the structure illustrated in FIG. 1.

FIGS. 11, 12, and 13 show the measured S21 characteristics, the measured S11 characteristics, and the measured S22 characteristics of an IDP chip having the structure illustrated in FIG. 1. In the graph shown in FIG. 11, the abscissa axis indicates the frequency (GHz), and the ordinate axis indicates the parameters. In the measurement, the pad 20 shown in FIG. 1 serves as a signal terminal, and the pad 21 serves as a ground terminal, so as to set a port 1. Also, the pad 18 serves as a signal terminal, and the pad 19 serves as a ground terminal, so as to set a port 2. As shown in FIG. 11, the IPD chip shown in FIG. 1 has almost no loss up to 2.05 GHz. Furthermore, as shown in FIGS. 12 and 13, excellent input-side and output-side reflection characteristics are achieved.

Although a few preferred embodiments of the present invention have been shown and described, it would be appreciated by those skilled in the art that changes may be made in these embodiments without departing from the principles and spirit of the invention, the scope of which is defined in the claims and their equivalents.

What is claimed is:

1. An electronic device comprising:
an insulating substrate;
at least one capacitor and an inductor that are formed directly on the insulating substrate the at least one capacitor including a lower electrode and an upper electrode;
a line that connects the upper electrode of the at least one capacitor and the inductor and is connected on a top surface of the upper electrode; and
an external connecting pad unit that is made of the same type of conductor as the line and is disposed on the insulating substrate.

2. The electronic device as claimed in claim 1, wherein the inductor has a lower electrode in the same plane as the lower electrode of the at least one capacitor.

3. The electronic device as claimed in claim 1, further comprising
an insulating film that covers the at least one capacitor and the inductor, with the line being disposed on the insulating film.

4. The electronic device as claimed in claim 1, wherein the electronic device is covered with an insulating film, except for the surface of the pad unit.

5. The electronic device as claimed in claim 1, wherein the line is formed across the inductor and the at least one capacitor in a free-standing state.

6. The electronic device as claimed in claim 1, further comprising a resistor.

7. The electronic device as claimed in claim 1, wherein the pad unit is disposed on a convexity of the insulating substrate.

8. The electronic device as claimed in claim 1, wherein the pad unit is formed with the same layer as the layer forming the inductor and the same layer as the layer forming the line.

9. The electronic device as claimed in claim 8, wherein the layer forming the line covers the outer periphery of at least one of regions formed with the same layer as the inductor.

10. The electronic device as claimed in claim 1, wherein the at least one capacitor has an upper electrode formed with the same layer as the inductor.

11. The electronic device as claimed in claim 1, wherein an insulating film is formed on an upper electrode of the at least one capacitor in such a manner as to cover the outer periphery of the upper electrode, with portions not covered with the insulating film being connected to the inductor via the line.

12. The electronic device as claimed in claim 1, wherein the electronic device is used at 2 GHz or lower.

13. The electronic device as claimed in claim 1, wherein:
the external connecting pad unit includes a lower electrode and an upper electrode; the inductor includes a lower electrode and an upper electrode;
the lower electrode of the external connecting pad unit is made of the same type of conductor as the lower electrode of the inductor; and
the upper electrode of the external connecting pad unit is made of the same type of conductor as the upper electrode of the inductor and the line.

* * * * *